(12) United States Patent
Yasutake

(10) Patent No.: US 8,159,051 B2
(45) Date of Patent: Apr. 17, 2012

(54) SEMICONDUCTOR DEVICE AND MANUFACTURING METHOD OF SEMICONDUCTOR DEVICE

(75) Inventor: Nobuaki Yasutake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 172 days.

(21) Appl. No.: 12/558,976

(22) Filed: Sep. 14, 2009

(65) Prior Publication Data

US 2010/0065928 A1    Mar. 18, 2010

(30) Foreign Application Priority Data

Sep. 12, 2008   (JP) ................................. 2008-235518

(51) Int. Cl.
*H01L 29/04* (2006.01)

(52) U.S. Cl. ........ 257/627; 257/412; 257/408; 257/628; 257/527

(58) Field of Classification Search .................. 257/408, 257/627–628

See application file for complete search history.

(56) References Cited

U.S. PATENT DOCUMENTS

| | | | | |
|---|---|---|---|---|
| 6,072,197 | A * | 6/2000 | Horino et al. .................. | 257/103 |
| 6,358,843 | B1 * | 3/2002 | Babcock et al. ............... | 438/637 |
| 7,052,974 | B2 * | 5/2006 | Mitani et al. .................. | 438/459 |
| 7,256,476 | B2 * | 8/2007 | Toba et al. ..................... | 257/627 |
| 7,422,956 | B2 * | 9/2008 | Waite et al. .................... | 438/406 |
| 7,541,629 | B1 * | 6/2009 | Zhu et al. ....................... | 257/288 |
| 7,619,239 | B2 * | 11/2009 | Irisawa et al. ................... | 257/19 |
| 7,663,195 | B2 * | 2/2010 | Ohmi et al. .................... | 257/409 |
| 7,754,560 | B2 * | 7/2010 | Burnett et al. ................. | 438/212 |
| 7,781,278 | B2 * | 8/2010 | Zhu ................................ | 438/199 |
| 7,829,401 | B2 * | 11/2010 | Yang et al. ..................... | 438/197 |
| 7,863,713 | B2 * | 1/2011 | Ohmi et al. .................... | 257/628 |
| 2001/0026006 | A1 * | 10/2001 | Noble et al. ................... | 257/627 |
| 2003/0209782 | A1 * | 11/2003 | Noble et al. ................... | 257/627 |
| 2004/0004271 | A1 * | 1/2004 | Fukuda et al. ................. | 257/616 |

(Continued)

OTHER PUBLICATIONS

Haizhou Yin, et al., "Direct Silicon Bonded (DSB) Substrate Solid Phase Epitaxy (SPE) Integration Scheme Study for High Performance Bulk CMOS", IEDM Tech. Dig., 2006, 4 pages.

(Continued)

*Primary Examiner* — Eugene Lee
*Assistant Examiner* — Mohammed Shamsuzzaman
(74) *Attorney, Agent, or Firm* — Oblon, Spivak, McClelland, Maier & Neustadt, L.L.P.

(57) ABSTRACT

In one aspect of the present invention, a semiconductor device may include a first semiconductor layer of a first conductivity type and having a main surface that has a first plane orientation, a second semiconductor layer of the first conductivity type and having a main surface that has a second plane orientation different from the first plane orientation, the second semiconductor layer being directly provided on the first semiconductor layer, a third semiconductor layer having a main surface that has the first plane orientation, and being formed on the first semiconductor layer and on a side face of the second semiconductor layer, a gate electrode formed on the second semiconductor layer via a gate insulating film, first impurity diffusion regions of a second conductivity type, and being formed in the second semiconductor layer so that the gate electrode is located on a region sandwiched in a gate length direction between the first impurity diffusion regions, the first impurity diffusion regions extending to an interface between the first and second semiconductor layers, and second impurity diffusion regions of a second conductivity type, and being formed so as to extend from the third semiconductor layers to the first semiconductor layer, respectively, so that both the first impurity diffusion regions is sandwiched in the gate length direction between the second impurity diffusion regions.

11 Claims, 8 Drawing Sheets

U.S. PATENT DOCUMENTS

| | | | |
|---|---|---|---|
| 2006/0118918 A1* | 6/2006 | Waite et al. | 257/627 |
| 2007/0085170 A1* | 4/2007 | Shin et al. | 257/627 |
| 2008/0001182 A1* | 1/2008 | Chen et al. | 257/255 |
| 2008/0079034 A1* | 4/2008 | Komoda | 257/255 |
| 2008/0157091 A1* | 7/2008 | Shin et al. | 257/66 |
| 2008/0160727 A1* | 7/2008 | Yeo et al. | 438/481 |
| 2008/0224182 A1* | 9/2008 | Saenger et al. | 257/255 |
| 2008/0283958 A1* | 11/2008 | Ohnuma | 257/506 |
| 2008/0303027 A1* | 12/2008 | Wise et al. | 257/66 |
| 2009/0057746 A1* | 3/2009 | Sugll et al. | 257/315 |
| 2009/0111244 A1* | 4/2009 | Yamazaki et al. | 438/458 |
| 2009/0115029 A1* | 5/2009 | Koyama et al. | 257/632 |
| 2009/0159932 A1* | 6/2009 | Pinto et al. | 257/255 |
| 2009/0166739 A1* | 7/2009 | Ohmi et al. | 257/351 |
| 2009/0173967 A1* | 7/2009 | Hamaguchi et al. | 257/190 |
| 2010/0032727 A1* | 2/2010 | Bu et al. | 257/255 |
| 2010/0047993 A1* | 2/2010 | Pinto et al. | 438/400 |
| 2010/0109055 A1* | 5/2010 | Kim | 257/255 |
| 2010/0117203 A1* | 5/2010 | Bailey et al. | 257/627 |
| 2010/0230762 A1* | 9/2010 | Burnett et al. | 257/369 |
| 2011/0031535 A1* | 2/2011 | Iwamatsu | 257/203 |

OTHER PUBLICATIONS

Haizhou Yin, et al., "Scalability of Direct Silicon Bonded (DSB) Technology for 32nm Node and Beyond", 2007 Symposium on VLSI Technology Digest of Technical Papers, pp. 222-223.

* cited by examiner

φB : Schottky barrier height
ρC : Silicide-silicon interface resistance
ND : Interfacial impurity concentration

SEMICONDUCTOR DEVICE AND MANUFACTURING METHOD OF SEMICONDUCTOR DEVICE

CROSS REFERENCE TO RELATED APPLICATION

This application is based upon and claims the benefit of priority from Japanese Patent Application No. 2008-235518, filed on Sep. 12, 2008, the entire contents of which are incorporated herein by reference.

BACKGROUND

In a MOS transistor of a 45-nm node or later generation, impurity distribution in impurity diffusion regions, especially in ultrashallow junction (extension) regions of source-drain regions extending under the gate electrode affects performance of the MOS transistor, such as the short channel effect thereof.

Here, the later node generation requires shallower ultrashallow junctions. However, the conventional processing method of forming ultrashallow junctions by firstly implanting impurity ions at a low acceleration voltage, and activating the implanted ions by low-temperature annealing has disadvantages such as variation in processing qualities, and these disadvantages causes a problem of making it difficult to accurately control the depth of ultrashallow junctions as required in various node generations.

Meanwhile, there has been known a semiconductor device using a silicon substrate that has a hybrid plane orientation for improving performance of a CMOS transistor.

H. Yin et al., "Direct Silicon Bonded (DSB) Substrate Solid Phase Epitaxy (SPE) Integration Scheme Study for High Performance Bulk CMOS," IE DM Tech. Dig., pp. 75-78, 2006 (hereinafter, referred to as Non-patent Document 1) discloses a semiconductor device utilizing the principle that the electron mobility is largest on the (100) plane while the hole mobility is largest on the (110) plane. The semiconductor device uses a silicon substrate having a first region whose plane orientation is (100) and a second region whose plane orientation is (110), and an n-type MOS transistor is formed in the first region while a p-type MOS transistor is formed in the second region.

This structure improves the current drive capability of the p-type MOS transistor, and thus provides a high-performance CMOS transistor.

Here, in the semiconductor device disclosed in Non-patent Document 1, a channel region, extension regions and source-drain regions are formed in a single plane-orientation region of each of the n-type MOS transistor and the p-type MOS transistor, namely, the first region in the n-type MOS transistor or the second region in the p-type MOS transistor. Thus, the semiconductor device disclosed in Non-patent Document 1 may have the problem of difficulty in controlling the depth of ultrashallow junctions, as in conventional semiconductor devices.

SUMMARY

Aspects of the invention relate to an improved semiconductor device.

In one aspect of the present invention, a semiconductor device may include a first semiconductor layer of a first conductivity type and having a main surface that has a first plane orientation, a second semiconductor layer of the first conductivity type and having a main surface that has a second plane orientation different from the first plane orientation, the second semiconductor layer being directly provided on the first semiconductor layer, a third semiconductor layer having a main surface that has the first plane orientation, and being formed on the first semiconductor layer and on a side face of the second semiconductor layer, a gate electrode formed on the second semiconductor layer via a gate insulating film, first impurity diffusion regions of a second conductivity type, and being formed in the second semiconductor layer so that the gate electrode is located on a region sandwiched in a gate length direction between the first impurity diffusion regions, the first impurity diffusion regions extending to an interface between the first and second semiconductor layers, and second impurity diffusion regions of a second conductivity type, and being formed so as to extend from the third semiconductor layers to the first semiconductor layer, respectively, so that both the first impurity diffusion regions is sandwiched in the gate length direction between the second impurity diffusion regions.

In another aspect of the invention, a method of manufacturing a semiconductor device may include, forming a gate electrode on a second semiconductor layer formed on a first semiconductor layer, with a gate insulating film interposed between the gate electrode and the second semiconductor layer, the first semiconductor layer of a first conductivity type and having a main surface that has a first plane orientation, the second semiconductor layer of the first conductivity type and having a main surface that has a second plane orientation different from the first plane orientation; forming a sidewall film on the gate electrode, and replacing, by using the sidewall films as a mask, regions outside the sidewall films in the second semiconductor layer with third semiconductor layers each having a main surface that has the first plane orientation, and forming first impurity diffusion regions and second impurity diffusion regions by removing the sidewall films, and thereafter by implanting second conductivity type impurity ions by using the gate electrode as a mask, the first impurity diffusion regions of a second conductivity type, formed in the second semiconductor layer so that the gate electrode is located on a region sandwiched in a gate length direction between the first impurity diffusion regions, and extending to an interface between the first and second semiconductor layers, the second impurity diffusion regions of the second conductivity type, and extending from the third semiconductor layers to the first semiconductor layer, respectively, so that both the first impurity diffusion regions is sandwiched in the gate length direction between the second impurity diffusion regions.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

Figure 3A:
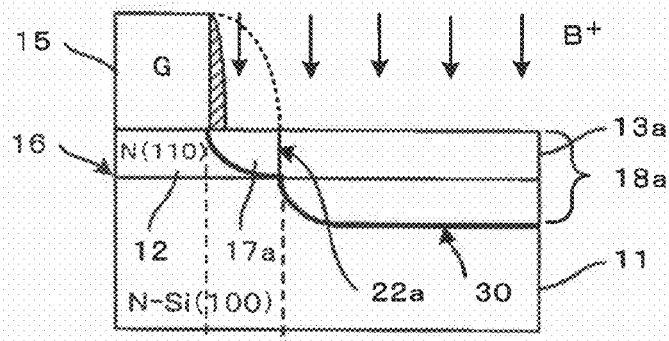
Figure 3B:
Figure 3C:
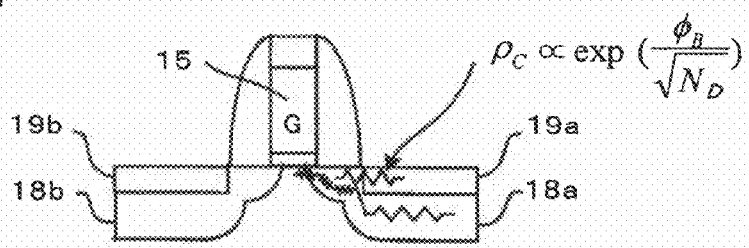

FIG. 3A shows a p-n junction profile in the width direction of the semiconductor device according to the embodiment. FIG. 3B shows a B concentration profile in the width direction of the semiconductor device according to the embodiment. FIG. 3C is a view for illustrating a silicide-silicon interface resistance.

FIGS. 4A to 7B are cross-sectional views sequentially showing a method of manufacturing the semiconductor device according to the embodiment.

Figure 8A:
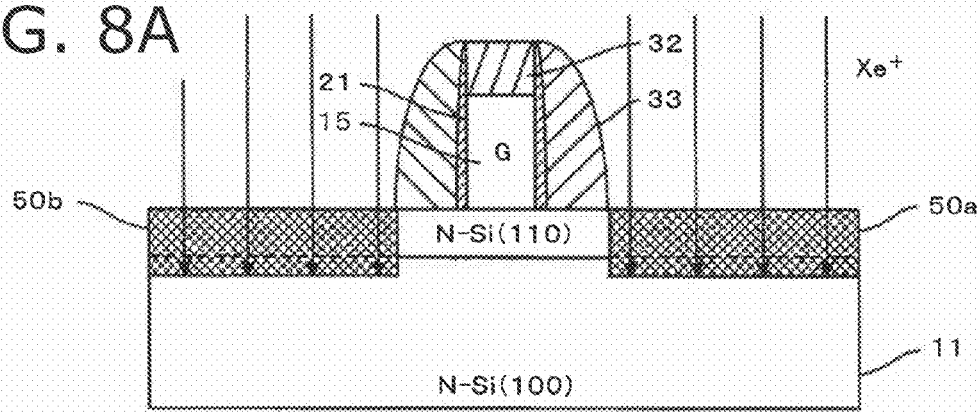
Figure 8B:
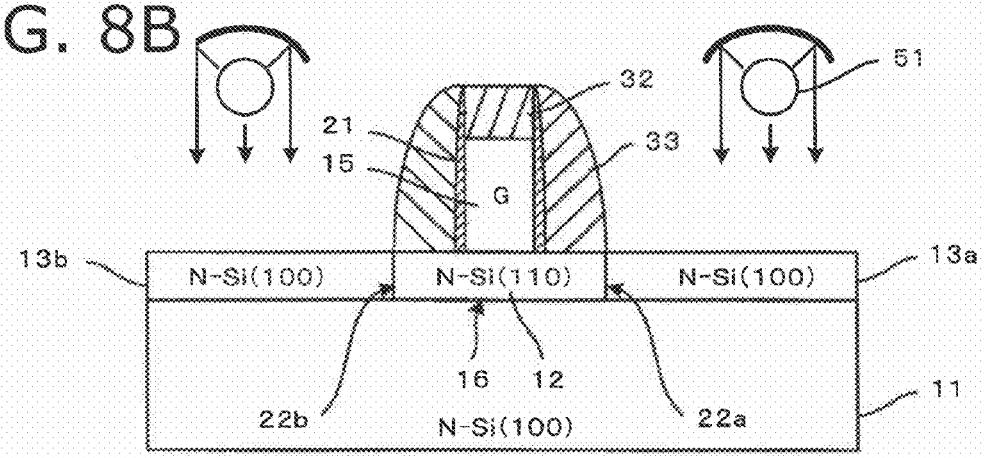

FIGS. 8A and 8B are cross-sectional views sequentially showing another method of manufacturing the semiconductor device according to the embodiment.

DETAILED DESCRIPTION

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

Embodiment

Figure 1:
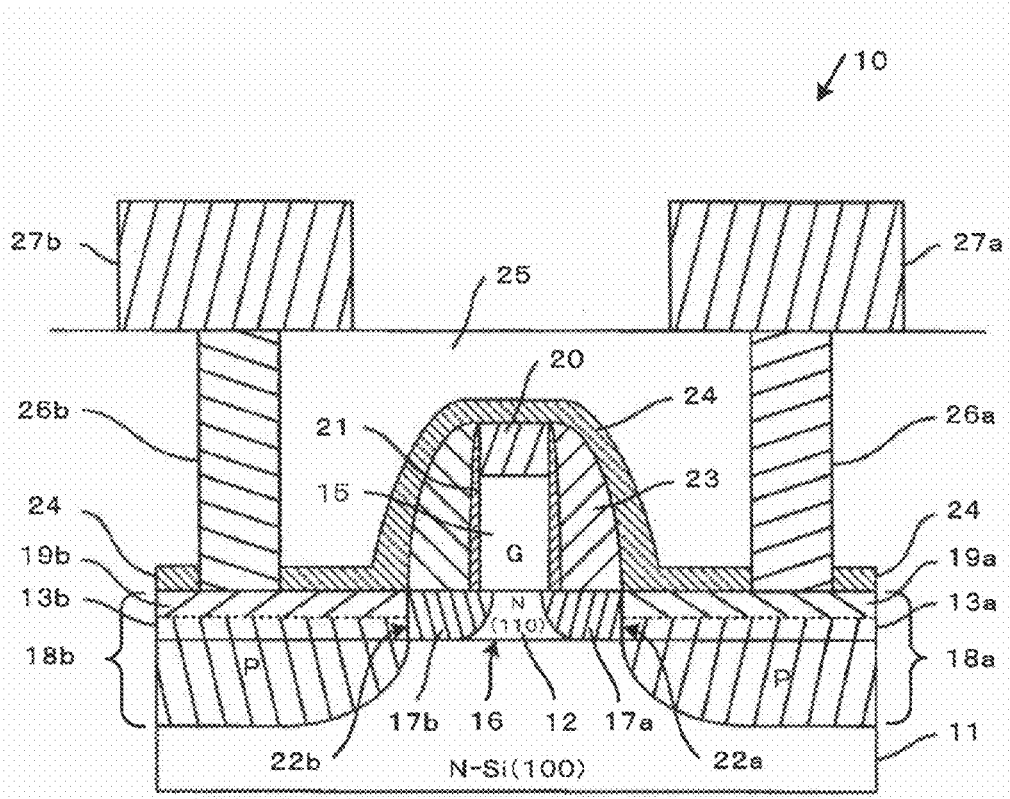
FIG. 1 is cross-sectional view of a semiconductor device according to an embodiment.

Hereinafter, with reference to FIGS. 1 to 7B, a description will be given of a semiconductor device according to an embodiment of the present invention and a manufacturing method thereof. FIG. 1 is a cross-sectional view of the semiconductor device. FIGS. 2A to 3C show properties of the semiconductor device. FIGS. 4A to 7B are cross-sectional views sequentially showing steps of manufacturing the semiconductor device.

As shown in FIG. 1, a semiconductor device 10 of this embodiment includes a first semiconductor layer 11, a second semiconductor layer 12 and third semiconductor layers 13a and 13b. The first semiconductor layer 11 is of a first conductivity type, and has a main surface having a first plane orientation (hereinafter, described as "has the first plane orientation"). The second semiconductor layer 12, which is of the first conductivity type, and has a second plane orientation different from the first plane orientation, is directly joined onto the first semiconductor layer 11. The third semiconductor layers 13a and 13b, which have the first plane orientation, are formed on the first semiconductor layer 11 so as to be connected respectively to both sides of the second semiconductor layer 12.

In addition, the semiconductor device 10 further includes a gate electrode 15, first impurity diffusion regions 17a and 17b, and second impurity diffusion regions 18a and 18b. The gate electrode 15 is formed on the second semiconductor layer 12 with a gate insulating film (not shown) interposed therebetween. The first impurity diffusion regions 17a and 17b are of a second conductivity type. The first impurity diffusion regions 17a and 17b are formed in the second semiconductor layer 12 so that the gate electrode 15 can be located on a region sandwiched in the gate length direction between the first impurity diffusion regions 17a and 17b, and extend to a joint surface 16 between the first and second semiconductor layers 11 and 12. The second impurity diffusion regions 18a and 18b are of the second conductivity type. The second impurity diffusion regions 18a and 18b are formed to extend from the third semiconductor layers 13a and 13b to upper portions of the first semiconductor layer 11, respectively, so that both the first impurity diffusion regions 17a and 17b can be sandwiched in the gate length direction between the second impurity diffusion regions 18a and 18b.

In addition, the semiconductor device 10 further includes silicide layers 19a and 19b, a silicide layer 20, sidewall films 23. The silicide layers 19a and 19b, which are nickel silicide layers, for example, are formed by siliciding upper portions of the third semiconductor layers 13a and 13b. The silicide layer 20 is formed by siliciding an upper portion of the gate electrode 15. Each of the sidewall films 23 is formed on one side surfaces of both the gate electrode 15 and the silicide layer 20 with an insulating film 21 interposed therebetween. The lower outer edges of the sidewall films 23 are located on the upper edges of connection surfaces 22a and 22b between the second semiconductor layer 12 and the third semiconductor layers 13a and 13b, respectively.

In addition, the semiconductor device 10 further includes a silicon nitride film 24, an interlayer insulating film 25 and interconnects 27a and 27b. The nitride film 24 is formed so as to conformally cover the silicide layers 19a, 19b and 20 and the sidewall films 23. The interlayer insulating film 25 is formed on the silicon nitride film 24. The interconnects 27a and 27b are electrically connected to the silicide layers 19a and 19b through vias 26a and 26b penetrating the interlayer insulating film 25, respectively.

The first semiconductor layer 11 is, for example, an n-type semiconductor layer (n-type well layer) formed on a p-type silicon substrate (not shown) having a plane orientation (100), and thus having the plane orientation (100).

The second semiconductor layer 12 is an n-type semiconductor layer having a plane orientation (110) and directly joined onto the first semiconductor layer 11.

The third semiconductor layers 13a and 13b are each a semiconductor layer having the plane orientation (100) and formed on the first semiconductor layer 11 so as to be connected to the second semiconductor layer 12. The conductivity type of the third semiconductor layers 13a and 13b may be p-type or n-type, namely, not particularly limited to one of them.

This is because, the second impurity diffusion regions 18a and 18b, which are p-type diffusion regions, are formed in the respective third semiconductor layers 13a and 13b by implanting B ions therein, as will be described later.

The second semiconductor layer 12 and the third semiconductor layers 13a and 13b have approximately the same thickness, which is set to on the order of 5 nm to 30 nm in accordance with node generations.

Each of the first impurity diffusion regions 17a and 17b is an ultrashallow junction (extension) region in which boron (B) ions, which are p-type impurity ions, are implanted. Each of the first impurity diffusion regions 17a and 17b extends in the width direction from under the gate electrode 15 to the corresponding one of the connection surfaces 22a and 22b, and extends in the depth direction to the joint surface 16.

Thus, the depth of each ultrashallow junction is the same as the thickness of the second semiconductor layer 12. Hereinafter, the first impurity diffusion regions 17a and 17b will also be referred to as extension regions 17a and 17b.

The second impurity diffusion regions 18a and 18b are source-drain regions formed by implanting B ions, which are p-type impurity ions, into the third semiconductor layers 13a and 13b and into the upper portions of the first semiconductor layer 11. The extension regions 17a and 17b serve as part of the source-drain regions. Hereinafter, the second impurity diffusion regions 18a and 18b will also be referred to as source-drain regions 18a and 18b.

The silicide layers 19a and 19b are formed to lower contact resistances between the source-drain regions 18a and 18b, and the vias 26a and 26b.

The silicide layer 20 is formed to lower a contact resistance between the gate electrode 15 and an gate interconnects (unillustrated).

The edges, facing the extension regions 17a and 17b, of the silicide layers 19a and 19b are located on the connection surfaces 22a and 22b between the second semiconductor layer 12 and the third semiconductor layers 13a and 13b, respectively. Thus, the silicide layers 19a and 19b take in the p-type impurity segregated at the connection surfaces 22a and 22b, so that a silicide-silicon interface resistance is reduced as will be described later.

Figure 2A:
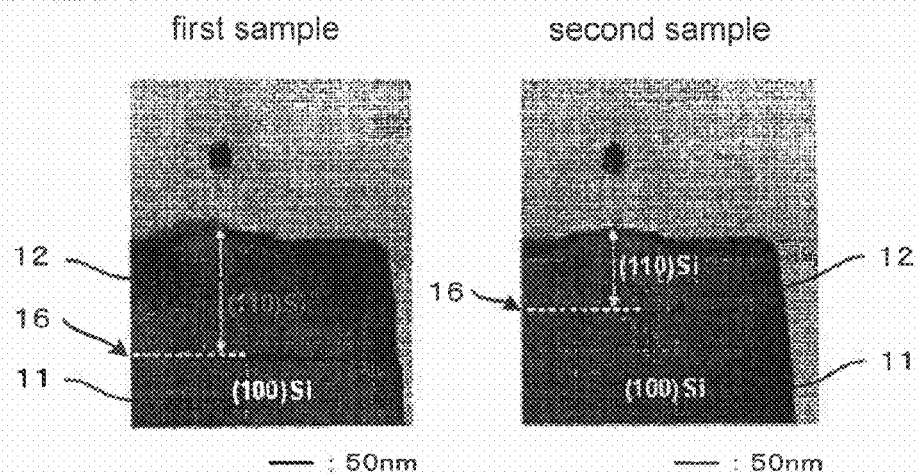
FIG. 2A shows a cross-sectional TEM image of the semiconductor device according to the embodiment.
Figure 2B:
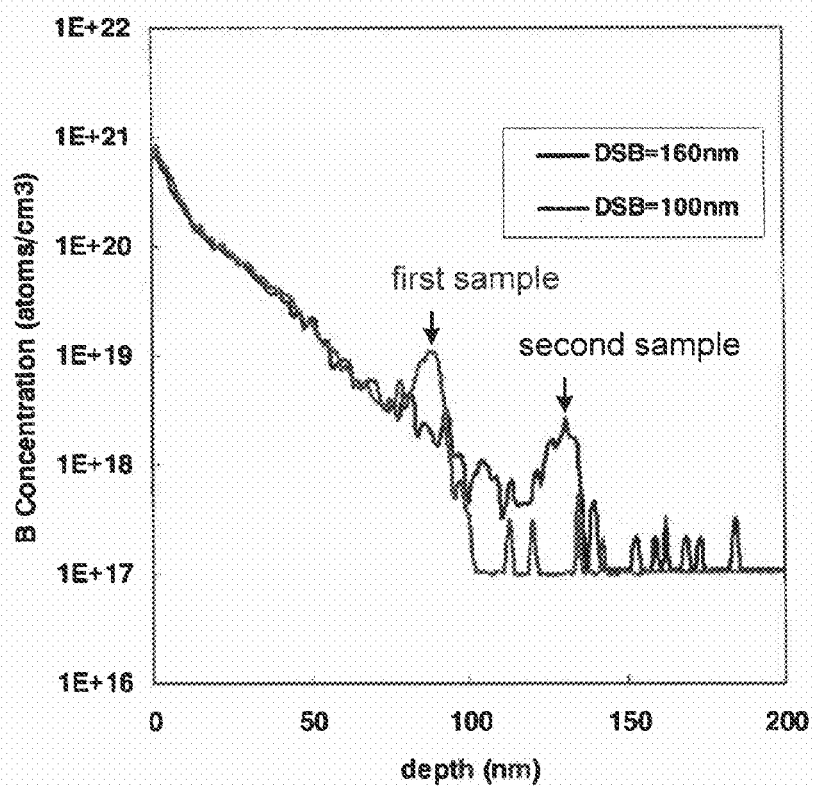
FIG. 2B shows an impurity profile in the depth direction of the semiconductor device according to the embodiment.

FIGS. 2A and 2B show properties of the semiconductor device 10. FIG. 2A shows a cross-sectional transmitting electron microscope (TEM) image of the semiconductor device 10, while FIG. 2B shows an impurity profile in the depth direction of the semiconductor device 10. FIGS. 3A to 3C show a p-n junction profile in the width direction of the semiconductor device 10.

As shown in FIG. 2A, a first sample and a second sample are cross-sectional TEM images respectively of two samples whose design values of the thickness of the second semiconductor layer 12 are different from each other. The design value of the thickness of the second semiconductor layer 12 is 160 nm in the first sample, and is 100 nm in the second sample.

Meanwhile, the cross-sectional TEM images show that the actual thickness of the second semiconductor layer 12 is at most 140 nm in the first sample, and is at most 90 nm in the second sample.

Note that the thickness of the second semiconductor layer 12 in each of the first and second samples is set larger than the above for test purpose.

As shown in FIG. 2B, the profiles of boron (B) which has been thermally activated in the second semiconductor layer 12 after being ionized and implanted therein as a p-type impurity are alike in the first and second samples in that the B concentration (at most 1E21 cm-3) reaches the maximum value at the surface of the second semiconductor layer 12 and decreases from the surface to the inside at an exponential rate.

However, in the first sample, the B concentration reaches its peak around a depth of 85 nm from the surface, and sharply decreases after the peak.

Meanwhile, in the second sample, the B concentration reaches its peak around a depth of 130 nm, and sharply decreases after the peak.

In this test, B ions were implanted under the conditions where an acceleration voltage is 1.5 keV, and a dose volume is 3E15 cm-2. The profiles of B were measured by secondary ion mass spectrometry (SIMS).

The test results show that implanted B ions reached the joint surface 16 between the first semiconductor layer 11 and the second semiconductor layer 12 but did hardly go beyond the joint surface 16 to reach the inside of the first semiconductor layer 11. In addition, the test results show that B was segregated in the vicinity of the joint surface 16.

This is presumed to be attributable to differences in channeling effect between the (110) plane and the (100) plane of silicon, as well as to the effect of lattice distortion at the joint surface 16.

In other words, since silicon atoms are orderly arranged on the (100) plane of silicon, the (100) plane has a plane orientation that makes implanted impurity ions more likely to be channeled than the (110) plane whose plane orientation are inclined at 45° to the (100) plane. Accordingly, the (100) plane allows the implanted B ions to reach greater depth in the silicon substrate through gaps in the atomic arrangement.

Meanwhile, the (110) plane of silicon has a narrower lattice spacing than the (100) plane of silicon, and thus has less gaps in the atomic arrangement. Hence, the (110) plane has a plane orientation that makes implanted impurity ions less likely to be channeled than the (100) plane. Accordingly, the (110) plane prevents the implanted B ions from reaching greater depth in the silicon substrate.

Moreover, lattice distortions attributable to differences in lattice spacing between the (110) and (100) planes are accumulated at the joint surface 16 between the (110) and (100) planes of silicon. Accordingly, the implanted B ions are trapped in the vicinity of the joint surface 16 to reduce the lattice distortions, and, after thermally treated, B is segregated in the vicinity of the joint surface 16.

FIGS. 3A to 3C show properties of the semiconductor device 10. FIG. 3A shows a p-n junction profile in the width direction of the semiconductor device 10. FIG. 3B shows a B concentration profile in the width direction of the semiconductor device 10. FIG. 3C is a view for illustrating a silicide-silicon interface resistance.

As shown in FIG. 3A, a p-n junction profile 30 in the width direction of the semiconductor device 10 has a two-step shape. This is because B ions implanted in the second semiconductor layer 12 hardly go beyond the joint surface 16 to reach the inside of the first semiconductor layer 11 while B ions implanted in the third semiconductor layers 13a and 13b go beyond the third semiconductor layers 13a and 13b to reach greater depth in the first semiconductor layer 11, as described above.

Thus, setting the thickness of the second semiconductor layer 12 to the design value of the thickness of the extension regions 17a and 17b enables the extension regions 17a and 17b serving as ultrashallow junctions to be automatically formed as designed irrespectively of variation in low acceleration voltages in ion implantation or in conditions in low-temperature annealing.

Moreover, an acceleration voltage in ion implantation may be adjusted so that designed source-drain regions can be obtained. This enables the source-drain regions 18a and 18b to be formed simultaneously with the extension regions 17a and 17b.

As shown in FIG. 3B, the B concentration profile in the width direction has its peak at the connection surface 22a between the second semiconductor layer 12 and the third semiconductor layer 13a.

This is because lattice distortions attributable to differences in lattice spacing between the (110) and (100) planes are accumulated at the connection surface 22a, as at the joint surface 16 between the first and second semiconductor layers 11 and 12. Accordingly, the implanted B ions are trapped in the vicinity of the connection surface 22a to reduce the lattice distortions, and, after heat-treated, B is segregated in the vicinity of the connection surface 22a.

As shown in FIG. 3C, since the B concentration has its peak at the connection surface 22a, a silicide-silicon interface resistance $\rho C$ can be reduced by locating the silicide-silicon interface between the silicide layer 19a and the extension region 17a on the connection surface 22a.

This is because, as is well known, the silicide-silicon interface resistance $\rho C$ decreases at an exponential rate inversely proportional to the square root of an interfacial impurity concentration ND, at a fixed Schottky barrier height $\phi B$. The same holds for the connection surface 22b, and thus the description thereof will be omitted.

Next, a description will be given of a method of manufacturing the semiconductor device 10. FIGS. 4A to 7B are cross-sectional views sequentially showing steps in the method of manufacturing the semiconductor device 10.

Figure 4A:
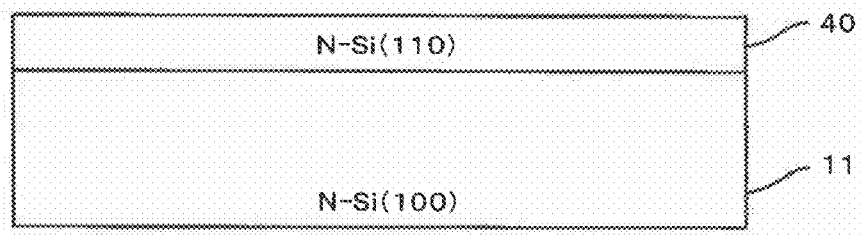

As shown in FIG. 4A, prepared is a substrate formed by directly joining an n-type (110) silicon substrate 40 having a predetermined thickness onto a p-type (100) silicon substrate (not shown) in which the first semiconductor layer 11 is formed as an n-type well layer.

As is well known, two silicon substrates are directly joined together by: firstly planarizing the surfaces of the silicon substrates; then cleaning the surfaces by a method such as plasma irradiation; then placing one on the other by starting from the centers thereof toward the peripheries; and lastly thermally treating the silicon substrates.

One of the directly-joined substrates is reduced in thickness firstly by polishing and then by repeating thermal oxidation and etching, and finally finished to have a predetermined thickness.

Figure 4B:
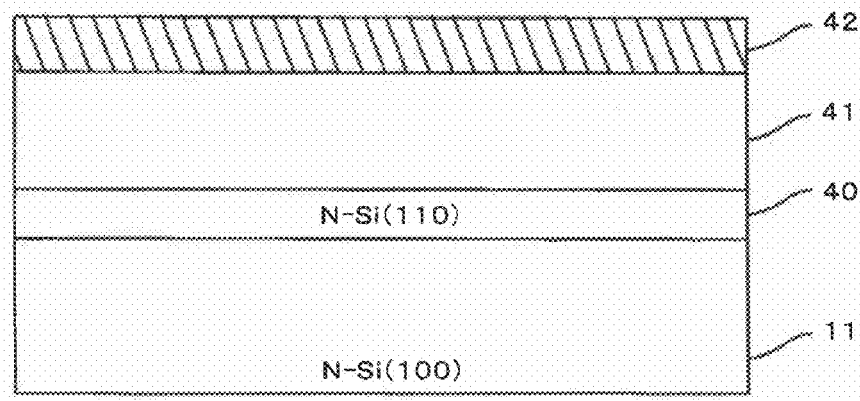

Next, as shown in FIG. 4B, a gate oxide film (not shown) is formed by thermally-oxidizing the surface of the n-type (110) silicon substrate 40, and a polysilicon film 41 is formed on the gate oxide film by a chemical vapor deposition (CVD) method. In addition, a silicon oxide film 42 is formed on the polysilicon film 41 by the CVD method.

Figure 4C:
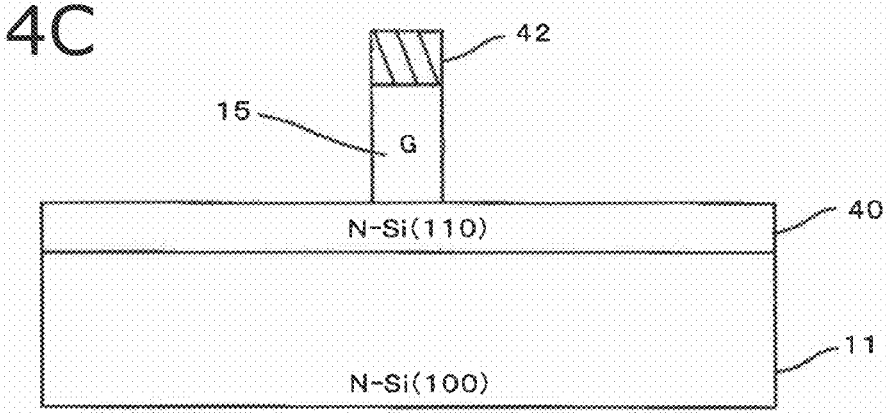

Next, as shown in FIG. 4C, the silicon oxide film 42 is patterned by lithography and anisotropic etching, and the gate electrode 15 is formed by anisotropically etching the polysilicon film 41 by using the silicon oxide film 42 as a mask.

Figure 5A:
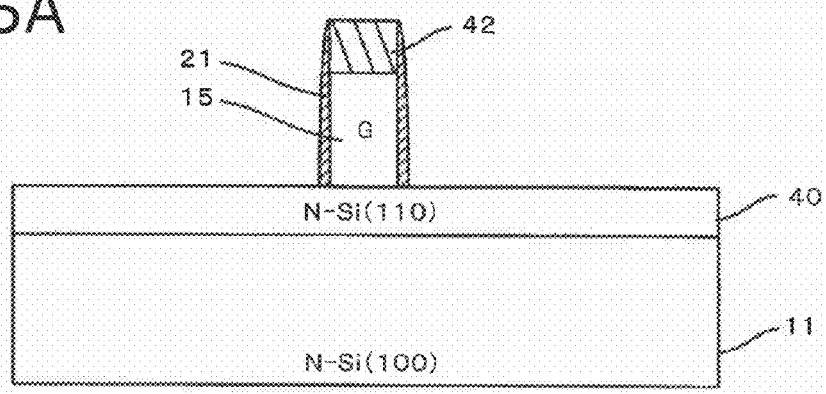

Next, as shown in FIG. 5A, the insulating film 21 is formed on each of the side surfaces of the gate electrode 15 by the following method. Firstly, post-gate oxidation is performed for controlling damages to the gate electrode 15. Then, an oxide film is conformally formed in a thickness of approximately 10 nm on the n-type (110) silicon substrate 40 including the gate electrode 15 by a method such as the CVD method. Lastly, the oxide film is selectively removed with part of the oxide film left on each side surface of the gate electrode 15.

Figure 5B:
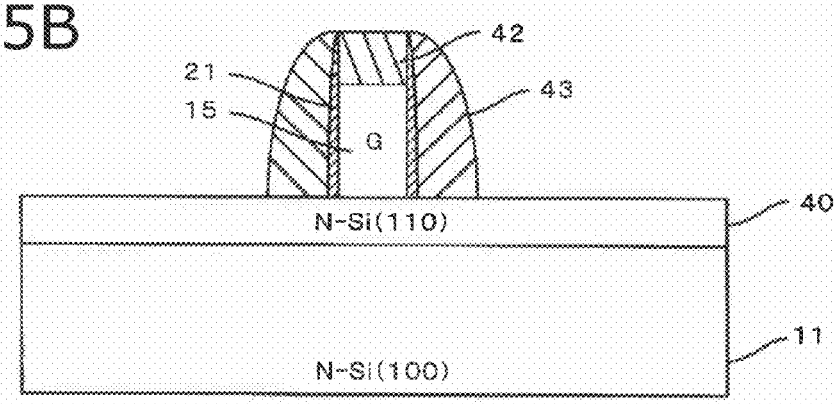

Next, as shown in FIG. 5B, sidewall films 43 are formed by conformally forming a nitride film on the n-type (110) silicon substrate 40 including the gate electrode 15 by a method such as a plasma CVD method, and then by anisotropically etching the nitride film by a reactive ion etching (RIE) method.

Figure 5C:
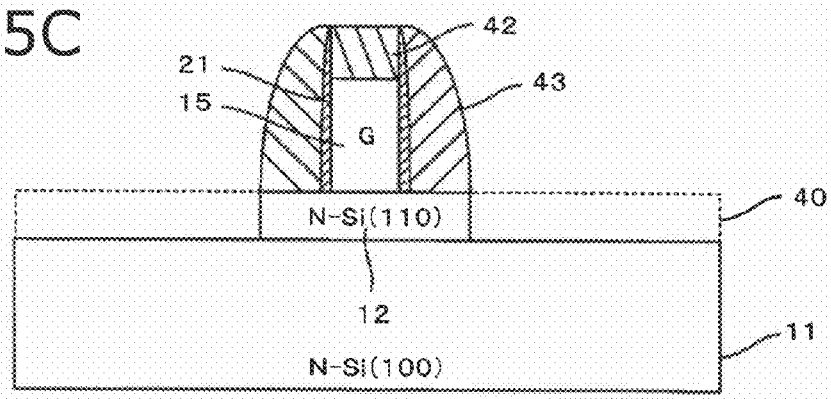

Next, as shown in FIG. 5C, regions outside the sidewall films 43 in the n-type (110) silicon substrate 40 is dug out by anisotropically etching the n-type (110) silicon substrate 40 by the RIE method using the sidewall films 43 as a mask, and thus the first semiconductor layer 11 is exposed in the regions. Thereby, the second semiconductor layer 12 is formed.

Figure 6A:
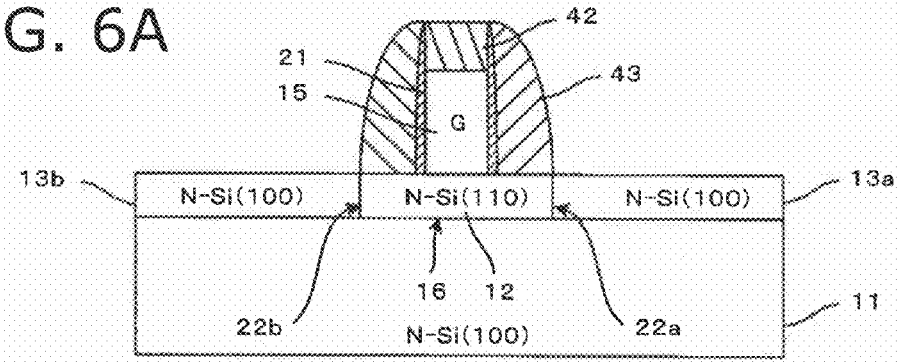

Next, as shown in FIG. 6A, silicon monocrystal is selectively and epitaxially grown on the exposed portions of the first semiconductor layer 11. Thereby, the third semiconductor layers 13a and 13b connected to the second semiconductor layer 12 are formed.

Figure 6B:
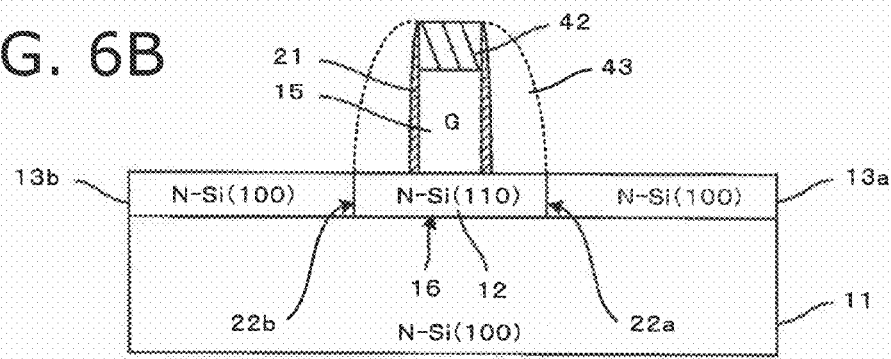

Next, as shown in FIG. 6B, the sidewall films 43, which are silicon nitride films, are removed by a method such as wet etching using hot phosphoric acid.

Figure 6C:
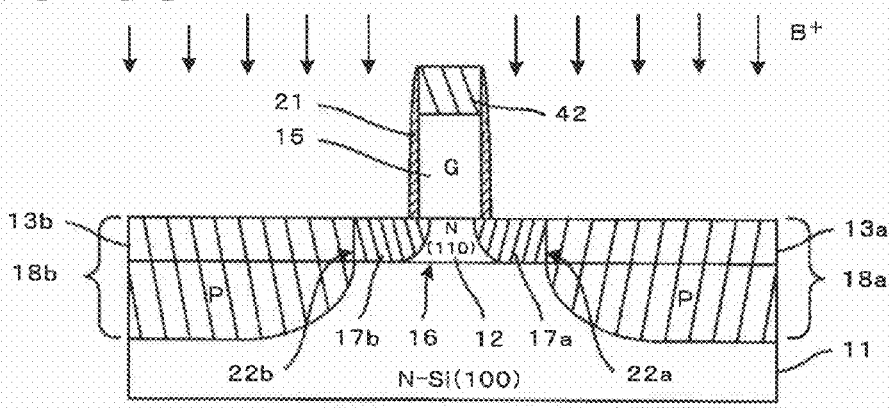

Next, as shown in FIG. 6C, B ions are implanted by using the gate electrode 15 as a mask. Thereby, the extension regions 17a and 17b are formed to automatically have a depth to the joint surface 16 in the second semiconductor layer 12.

At the same time, the source-drain regions 18a and 18b are also formed to extend from the third semiconductor layers 13a and 13b to the upper portions of the first semiconductor layer 11, respectively.

Figure 7A:
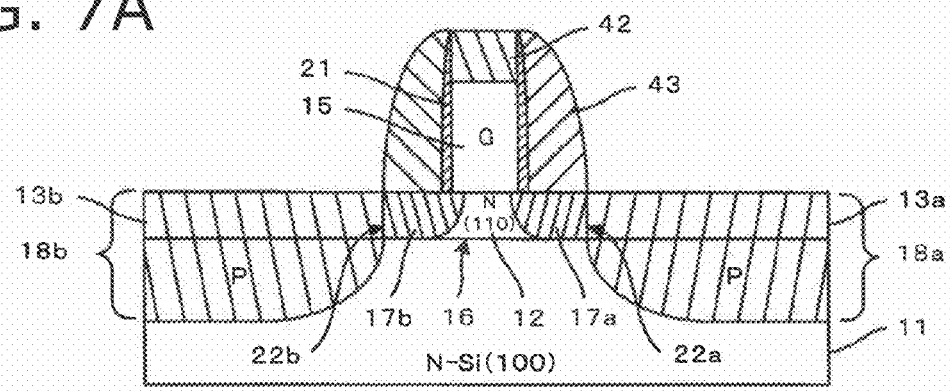

Next, as shown in FIG. 7A, the sidewall films 23 are formed by conformally forming a nitride film on the third semiconductor layers 13a and 13b including the gate electrode 15 by a method such as the plasma CVD method, and then by anisotropically etching the nitride film by the RIE method.

In this step, the thickness of the nitride film is adjusted so that the lower outer edges of the sidewall films 23 can be located on the upper edges of the connection surfaces 22a and 22b between the second semiconductor layer 12 and the third semiconductor layers 13a and 13b, respectively.

Then, the top surface of the gate electrode 15 is exposed by removing the silicon oxide film 42 on the gate electrode 15.

Figure 7B:
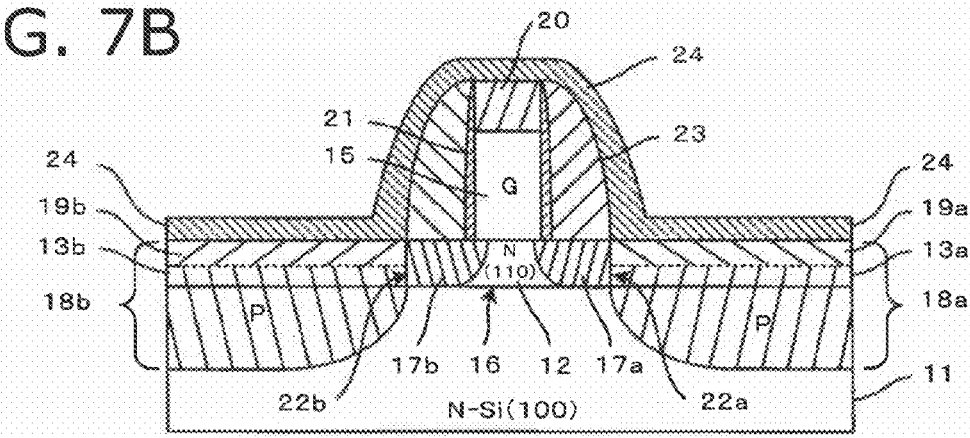

Next, as shown in FIG. 7B, upper portions of the third semiconductor layers 13a and 13b are transformed into the silicide layers 19a and 19b while an upper portion of the gate electrode 15 is transformed into the silicide layer 20. The silicidation is performed by depositing nickel serving as a silicide material on the third semiconductor layers 13a and 13b and on the gate electrode 15, by a method such as a sputtering method, and by thermally treating these upper portions.

This makes the edges, facing the extension regions 17a and 17b, of the silicide layers 19a and 19b to be located on the connection surfaces 22a and 22b between the second semiconductor layer 12 and the third semiconductor layers 13a and 13b, respectively. Accordingly, the silicide-silicon interface resistance in the semiconductor device 10 can be lowered.

Next, the silicon nitride film 24 serving as a protective film is conformally formed on the silicide layers 19a, 19b and 20 including the sidewall films 23.

Then, a Tetra-Ethyl-Ortho-Silicate (TEOS) film to serve as the interlayer insulating film 25 is formed on the silicon nitride film 24 by a method such as the CVD method.

Next, contact holes are formed in the interlayer insulating film 25 by using the silicon nitride film 24 as a stopper. Then, the silicon nitride film 24 at the bottom of each contact hole is removed, and the contact hole is filled with a conductive material such as copper (Cu). Thereby, the vias 26a and 26b connected to the silicide layers 19a and 19b are formed.

Next, the interconnects 27a and 27b connected to the respective vias 26a and 26b are formed on the interlayer insulating film 25. In this way, the semiconductor device 10 shown in FIG. 1 is obtained.

As described above, in this embodiment, the semiconductor device 10 includes: the first semiconductor layer 11 having the first plane orientation; the second semiconductor layer 12 having the second plane orientation and directly joined onto the first semiconductor layer 11; and the third semiconductor layers 13a and 13b having the first plane orientation and formed on the first semiconductor layer 11 so as to be connected to the second semiconductor layer 12. In addition, the gate electrode 15 is formed on the second semiconductor layer 12 in which the extension regions 17a and 17b are formed, and the source-drain regions 18a and 18b are formed to extend from the third semiconductor layers 13a and 13b to the upper portions of the first semiconductor layer 11, respectively.

As a result, the bottoms of the ultrashallow junctions can be located near the joint surface 16 by utilizing differences in channeling effect between the first and second semiconductor layers 11 and 12.

This means that the depth of the extension regions 17a and 17b can be controlled by changing the thickness of the second semiconductor layer 12.

Note that changing the thickness of the second semiconductor layer 12 does not affect the source-drain regions 18a and 18b. Thus, this embodiment can provide a semiconductor device in which the depth of ultrashallow junctions is accurately controlled and a manufacturing method thereof.

Another Embodiment

Hereinabove, a description has been given of the case where the parts of the second semiconductor layer 12 are replaced with the third semiconductor layers 13a and 13b by partially removing the second semiconductor layer 12 and then by epitaxially and selectively growing the monocrystal layers on the exposed portions of the first semiconductor layer 11. However, the replacement may be performed by other methods such as firstly transforming the second semiconductor layer 12 into an amorphous layer, and then growing a monocrystal layer on the first semiconductor layer by solid-phase epitaxial growth.

FIGS. 8A and 8B are cross-sectional views sequentially showing the steps for replacing the second semiconductor layer 12 with the third semiconductor layers 13a and 13b by solid-phase epitaxial growth.

As shown in FIG. 8A, the second semiconductor layer 12 is partially transformed into amorphous layers 50a and 50b by implanting impurity ions into the second semiconductor layer 12 by using the sidewall films 43 as a mask.

An impurity having a large mass number, and not affecting electrical properties of the second semiconductor layer 12, such as xenon (Xe) or germanium (Ge), is suitable for use in this ion implantation.

In this step, the second semiconductor layer 12 needs to be completely amorphized including the bottom thereof. Accordingly, in consideration of variation in processing qualities, the amorphization should preferably be performed so that the upper surface of the first semiconductor layer 11 can be amorphized as well.

This is necessary to reliably propagate the information on the (100) plane serving as a seed in the solid-phase epitaxial growth.

Next, as shown in FIG. 83, the amorphous layers 50a and 50b are recrystallized by thermal treatment such as annealing using lamps 51, and thus formed into the third semiconductor layers 13a and 13b being of the first conductivity type and having the first plane orientation, which is the same as that of the first semiconductor layer 11.

Hereinabove, description has been given of the case where the semiconductor device 10 is a p-type MOS transistor. However, the semiconductor device 10 may be formed as an n-type MOS transistor.

Forming as an n-type MOS transistor is disadvantageous from the viewpoint of current drive capability since the electron mobility is reduced than in the (100) plane, but is suitable for the case where the capability of controlling the depth of ultrashallow junctions is an priority.

Moreover, though the case where the second plane orientation is (100) has been described, the second plane orientation may be any plane orientation between (100) and (110) as long as it provides the intended depth of ultrashallow junctions. Alternatively, the second plane orientation need not necessarily be a certain plane orientation, but may be an off-angle plane between (100) and (110).

The condition where off-angle from the (100) plane is smaller than off-angle from the (110) plane has an advantage of improving a material efficiency in manufacturing an off-angle substrate if it is manufactured by obliquely cutting a (100) monocrystal ingot produced by the pulling technique.

Though the description has been given of the case where the silicide layers 19a, 19b and 20 are made of nickel silicide, the silicide layers 19a, 19b and 20 may be made of other silicides such as cobalt silicide, iridium silicide, platinum silicide and palladium silicide.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
 a first semiconductor layer of a first conductivity type and having a main surface that has a first plane orientation;
 a second semiconductor layer of the first conductivity type and having a main surface that has a second plane orientation exhibiting lesser channeling effect compared to the first plane orientation, the second semiconductor layer being directly provided on the first semiconductor layer;
 a third semiconductor layer having a main surface that has the first plane orientation, and being formed on the first semiconductor layer and on a side face of the second semiconductor layer;
 a gate electrode formed on the second semiconductor layer via a gate insulating film;
 first impurity diffusion regions of a second conductivity type serving as source drain extensions, and being formed in the second semiconductor layer so that the gate electrode is located on a region sandwiched in a gate length direction between the first impurity diffusion regions, the first impurity diffusion regions extending to an interface between the first and second semiconductor layers; and
 second impurity diffusion regions of a second conductivity type, and being formed in the first semiconductor layer and the third semiconductor layer, and being formed so as to extend from the third semiconductor layers to the first semiconductor layer, respectively, so that both the first impurity diffusion regions are sandwiched in the gate length direction between the second impurity diffusion regions.

2. The semiconductor device according to claim 1, wherein the first plane orientation makes implanted impurity ions more likely to be channeled than the second plane orientation.

3. The semiconductor device according to claim 1, wherein the first plane orientation is (100), and the second plane orientation is (110).

4. The semiconductor device according to claim 1, further comprising, a silicide layer provided on an upper portion of the third semiconductor layer.

5. The semiconductor device according to claim 4, wherein the silicide layer has an edge which faces the first impurity region and the edge is located on an interface between the second semiconductor layer and the third semiconductor layers.

6. The semiconductor device according to claim 1, wherein the first semiconductor layer has a recess portion and the third semiconductor layer is provided on the recess portion of the first semiconductor layer.

7. The semiconductor device according to claim 1, wherein the third semiconductor layer has the second conductivity type impurity.

8. The semiconductor device according to claim 7, wherein the second conductivity type impurity is piled up near the interface between the second semiconductor layer and the third semiconductor layer.

9. The semiconductor device according to claim 3, wherein the third semiconductor layer has the second conductivity type impurity.

10. The semiconductor device according to claim 9, wherein the second conductivity type impurity is piled up near the interface between the second semiconductor layer and the third semiconductor layer.

11. The semiconductor device according to claim 1, wherein the second conductivity type impurity is piled up near the interface between the second semiconductor layer and the first semiconductor layer.

* * * * *